US008405592B2

(12) United States Patent
Chiu

(10) Patent No.: US 8,405,592 B2
(45) Date of Patent: Mar. 26, 2013

(54) DRIVING APPARATUS, SYSTEM AND METHOD THEREOF

(75) Inventor: Wei-Ta Chiu, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 1084 days.

(21) Appl. No.: 12/134,212

(22) Filed: Jun. 6, 2008

(65) Prior Publication Data

US 2009/0085852 A1 Apr. 2, 2009

(30) Foreign Application Priority Data

Sep. 29, 2007 (TW) ................................ 96136579 A

(51) Int. Cl.
*G09G 3/36* (2006.01)
*H03D 3/24* (2006.01)
*H02M 5/42* (2006.01)
*G05F 1/33* (2006.01)

(52) U.S. Cl. ................ 345/92; 345/87; 345/94; 345/98; 345/99; 375/376; 363/89; 323/251

(58) Field of Classification Search ................... 388/915
See application file for complete search history.

(56) References Cited

U.S. PATENT DOCUMENTS 6,381,154 B1 * 4/2002 Nguyen .......................... 363/41
6,449,175 B1 * 9/2002 Cuadra et al. .................... 363/89
2005/0111607 A1 * 5/2005 Loke et al. .................... 375/376

FOREIGN PATENT DOCUMENTS

TW 464837 11/2001

OTHER PUBLICATIONS

"Office Action of Taiwan Counterpart Application", issued on Sep. 5, 2011, p. 1-p. 7, in which the listed reference was cited.

* cited by examiner

*Primary Examiner* — Sumati Lefkowitz
*Assistant Examiner* — Andrew Yeretsky
(74) *Attorney, Agent, or Firm* — Jianq Chyun IP Office

(57) ABSTRACT

A driving apparatus, a system and a method thereof is provided by the present invention. The driving apparatus has at least an output terminal and includes a driving circuit and a control switch. The control switch is electrically coupled with the driving circuit. The driving circuit receives an input signal and converts the input signal into an analog driving signal. The control switch is controlled by a control signal. When the control switch is turned on, the analog driving signal is able to be sent to the output terminal of the driving apparatus. The control signal further controls the spike current generated as turning on the control switch so as to reduce the spike current. The driving apparatus can be applied to an LCD system, so that the panel and the chips of the LCD system have longer life time, lower electricity consumption and better heat dissipation performance.

6 Claims, 12 Drawing Sheets

DRIVING APPARATUS, SYSTEM AND METHOD THEREOF

CROSS-REFERENCE TO RELATED APPLICATION

This application claims the priority benefit of Taiwan application serial no. 96136579, filed on Sep. 29, 2007. The entirety of the above-mentioned patent application is hereby incorporated by reference herein and made a part of specification.

BACKGROUND OF THE INVENTION

1. Field of the Invention

The present invention generally relates to a driving apparatus and a method of reducing the spike current thereof, and more particularly, to a driving apparatus applied to an liquid crystal display system (LCD system) and a method of reducing the spike current thereof.

2. Description of Related Art

An LCD system includes a driving apparatus for converting an input signal into an analog driving signal so as make the LCD system display an image specified by the input signal. However, a conventional driving apparatus applied to an LCD system would produce a huge spike current at a conductive moment, which may damage the chips and the panel of the LCD system due to the huge spike current.

FIG. 1 is a circuit diagram of a conventional LCD system 100. Referring to FIG. 1, an LCD system 100 includes a row decoder 101, a column decoder 102 and a plurality of panel units 103, wherein the panel unit 103 is electrically coupled with the row decoder 101 and the column decoder 102. The column decoder 102 is used for outputting a switching signal so as to start up the panel unit 103; the row decoder 101 has a plurality of driving circuits, and the row decoder 101 converts an input signal into an analog driving signal through the driving circuit and outputs the analog driving signal to the panel unit 103, so that the panel unit 103 displays an image specified by the input signal.

The panel unit 103 includes a thin-film-transistor (TFT, hereafter) 1030, a capacitor 1031 and a liquid crystal unit 1032, wherein the capacitor 1031 is electrically coupled with the source S of the TFT 1030, the liquid crystal unit 1032 is electrically coupled with the source S of the TFT 1030, the gate G of the TFT 1030 is electrically coupled with the column decoder 102 and the drain D of the TFT 1030 is electrically coupled with the row decoder 101. The TFT 1030 decides whether or not to deliver an analog driving signal output from the row decoder 101 to the capacitor 1031 and the liquid crystal unit 1032 according to a switching signal output from the column decoder 102. Once the voltage level of the switching signal output from the column decoder 102 makes the voltage difference $V_{gs}$ between the gate G and the source S of the TFT 1030 greater than a threshold voltage $V_t$ (i. e. $V_{gs}>V_t$), a conductive path is established between the source S and the drain D of the TFT 1030. Moreover, the analog driving signal output from the row decoder 101 is able to reach the source S via the drain D of the TFT 1030 to charge the capacitor 1031 and make the liquid crystal unit 1032 luminant to display an image specified by the input signal.

The above-mentioned TFT 1030 with the driving circuit of the row decoder 101 together can be considered as a conventional driving apparatus applied to an LCD system 100. FIG. 2 is a circuit diagram of a conventional driving apparatus 200 applied to the LCD system 100. Referring to FIG. 2, a conventional driving apparatus 200 includes a driving circuit 1010 and a TFT 1030. The driving circuit 1010 is used for converting an input signal input_voltage into an analog driving signal. The gate of the TFT 1030 is controlled by a switching signal TFT_open_sig. When the path between the source S and the drain D of the TFT 1030 is turned on, the analog driving signal is output to the source S via the drain D of the TFT 1030 to charge the capacitor 1031 and make the liquid crystal unit 1032 luminant to display an image specified by the input signal.

However, when the rising speed and the falling speed of the above-mentioned switching signal TFT_open_sig are not ideal as expected, as a result, the analog driving signal may overwrite the image produced by the preceding analog driving signal of the liquid crystal unit 1032. Thus, most conventional driving apparatuses would employ an additional control switch at the output terminal of the driving circuit 1010 to avoid the above-described problem.

FIG. 3 is a circuit diagram of another conventional driving apparatus 300 applied to the LCD system 100 and FIG. 4 is a signal waveform diagram of the conventional driving apparatus 300. Referring to FIGS. 3 and 4, a conventional driving apparatus 300 includes a driving circuit 1010, a control switch 301 and a TFT 1030, wherein the control switch 301 is electrically coupled with the driving circuit 1010 and the TFT 1030, and the control switch 301 is a part of the row decoder 101 (referring to FIG. 1). The driving circuit 1010 is used for converting an input signal input_voltage into an analog driving signal output_sig. The gate G of the TFT 1030 receives a switching signal TFT_open_sig. When the TFT 1030 is turned on by the switching signal TFT_open_sig, the path between the drain D and the source S of the TFT 1030 is conductive, but a control signal control_sig blocks the control switch 301 to be turned on, which ensures the analog driving signal output from the driving circuit 1010 does not wrongfully overwrite the image produced by the preceding analog driving signal of the liquid crystal unit 1032 (as shown at time $t_1$ in FIG. 4). After that, when the control switch 301 is turned on by the control signal control_sig, the path between both terminals of in_end and out_end of the control switch 301 is conductive, so that the analog driving signal output_sig output from the driving circuit 1010 is sent to the capacitor 1031 and the liquid crystal unit 1032 and the analog driving signal output_sig is able thereby to charge the capacitor 1031 and make the liquid crystal unit 1032 display the expected image specified by the input signal (as shown at time $t_2$ in FIG. 4). Then, when the control switch 301 is turned off, the analog driving signal output_sig output from the driving circuit 1010 would maintain at a fixed output voltage level (as shown at time $t_3$ in FIG. 4). Furthermore, the TFT 1030 is turned off, the analog driving signal output_sig output from the driving circuit 1010 would maintain at a fixed output voltage level (as shown at time $t_4$ in FIG. 4). Finally, when the control switch 301 is turned on again, the level of the analog driving signal output_sig would fall to a low level (as shown at time $t_5$ in FIG. 4).

Although the above-described driving apparatus is able to avoid the problem that the analog driving signal would overwrite the image produced by the preceding analog driving signal of the liquid crystal unit however, the driving apparatus may produce a spike current with a surging peak at the moment the control switch is turned on, and the spike current would flow in to and out from the chips and the panel of the LCD system. The spike current not only makes the chips and the panel of the LCD system generate larger power consumption and degrades heat dissipation performance, but also further damage the panel of the chips of the LCD system.

Confronting the above-described problem, lots of panel manufactures are eager to develop a driving apparatus capable of reducing spike current and the method thereof to be applied to an LCD system, so that the panel and the chips of an LCD system have longer life time, lower electricity consumption and better heat dissipation performance.

SUMMARY OF THE INVENTION

Accordingly, the present invention is directed to a driving apparatus capable of reducing spike current. The provided driving apparatus is suitable for an LCD system to make the panel and the chips of an LCD system have longer life time, lower electricity consumption and better heat dissipation performance.

The present invention is also directed to an LCD system having longer life time, lower electricity consumption and better heat dissipation performance, and having a driving apparatus capable of reducing spike current.

The present invention is further directed to a control switch, which has a lower spike current as the control switch is turned on. The provided control switch is suitable for an LCD system so that the panel and the chips of the LCD system have longer life time, lower electricity consumption and better heat dissipation performance.

The present invention is yet further directed to a method of reducing spike current generated by the driving apparatus. The provided method is suitable for a driving apparatus in an LCD system so that the panel and the chips of the LCD system have longer life time, lower electricity consumption and better heat dissipation performance.

The present invention is yet further directed to a method of reducing spike current generated by the control switch. The provided method is suitable for a driving apparatus in an LCD system so that the panel and the chips of the LCD system have longer life time, lower electricity consumption and better heat dissipation performance.

The present invention provides a driving apparatus having at least an output terminal and the driving apparatus includes a driving circuit and a control switch. The control switch herein is electrically coupled with the driving circuit. The driving circuit is used for receiving an input signal and converts the received input signal into an analog driving signal. The control switch is used for receiving a control signal to control on or off of the control switch. When the control switch is turned on, the analog driving signal is delivered to the output terminal of the driving apparatus. The control signal further controls the spike current as the control switch is on so as to lower down the spike current.

According to an embodiment of the present invention, the control signal is generated by a control signal generator. The control signal generator includes a current source, a capacitor, a first switch and a second switch. The first switch herein is electrically coupled with the current source and the capacitor and the second switch is electrically coupled with the capacitor. The capacitor is used for charging and discharging, and the first and second switches are controlled by a clock signal. The control signal generator has an output terminal of control signal located between the first switch and the capacitor for outputting the control signal. When the first switch is turned on, the second switch is turned off, so that the current source charges the capacitor; when the second switch is turned on, the first switch is turned off, so that the capacitor discharges via the second switch.

The present invention provides an LCD system. The LCD system receives an input signal and includes at least a panel unit, a column decoder and a row decoder. The panel unit is used for displaying images specified by the input signal and includes a TFT, a capacitor and a liquid crystal unit. The capacitor is electrically coupled with the TFT and the liquid crystal unit is electrically coupled with the TFT and the capacitor. The column decoder is used for control on or off of the TFT. The row decoder has a driving apparatus for converting the input signal into an analog driving signal and sending the analog driving signal to the panel unit, so that the panel unit displays an image specified by an input data, wherein the driving apparatus includes a driving circuit and a control switch. The driving circuit is used for receiving the input signal and converting the input signal into a driving signal. The control switch is used for receiving the control signal, wherein the control signal is used for controlling on or off of the control switch and the spike current generated as the control switch is turned on so as to lower down the spike current.

The present invention provides a control switch having an input terminal, an output terminal and a control terminal. The control terminal is used for receiving the control signal to control on or off of the control switch, and the control signal further controls the impedance between the input terminal and the output terminal of the control switch as turning on the switch so as to lower down the spike current generated at the moment.

According to an embodiment of the present invention, the control switch is a transistor.

The present invention provides a method of reducing the spike current generated by the driving apparatus. The driving apparatus herein has a control switch disposed at the output terminal of the driving apparatus. The method includes following steps: first, generating a control signal; next, controlling the control switch located at the output terminal of the driving apparatus by using the control signal, wherein the control signal is used for controlling on or off of the control switch located at the output terminal of the driving apparatus and controlling the spike current generated as the control switch is turned on so as to lower down the spike current.

The present invention provides a method of reducing the spike current generated by the control switch. The control switch herein includes a control terminal, an input terminal and an output terminal. The control terminal is used for receiving the control signal. The method includes following steps: first, generating a control signal; next, controlling the control switch by using the control signal, wherein the control signal is used for controlling on or off of the control switch and further controlling the impedance between the input terminal and the output terminal as the control switch is turned on so as to lower down the spike current.

The present invention uses a control signal to control and thereby to lower down the spike current of the control switch, which makes the spike current generated by the driving apparatus, the LCD system and the control switch provided by the present invention less that that of the prior art. Therefore, the chips and the panel of the LCD system provided by the present invention have longer life time, lower electricity consumption and better heat dissipation performance; moreover, the chips and the panel of the LCD system employing the driving apparatus and the control switch provided by the present invention have longer life time, lower electricity consumption and better heat dissipation performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
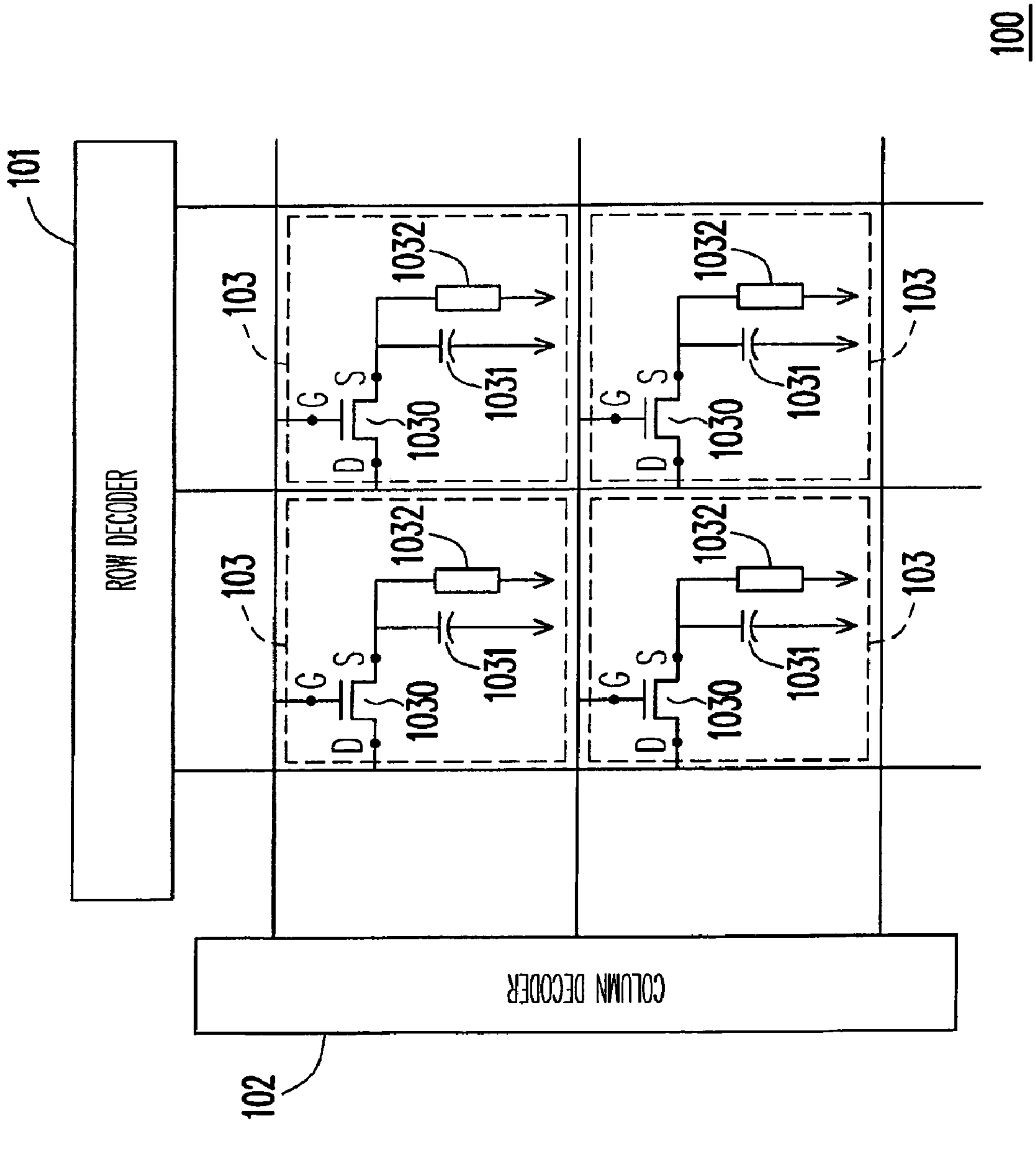
FIG. 1 is a circuit diagram of a conventional LCD system 100.
Figure 2:
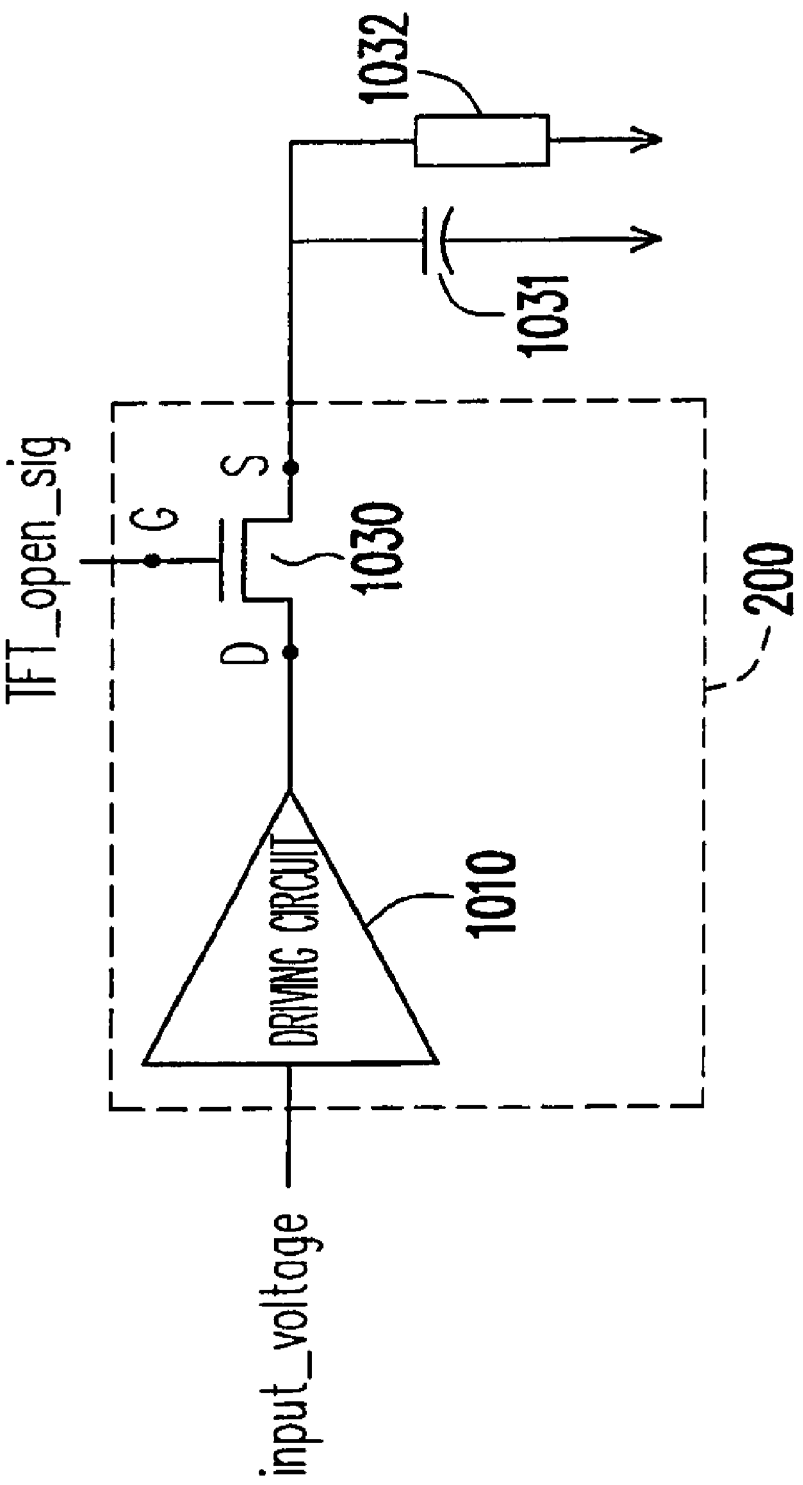
FIG. 2 is a circuit diagram of a conventional driving apparatus 200 applied to the LCD system 100.
Figure 3:
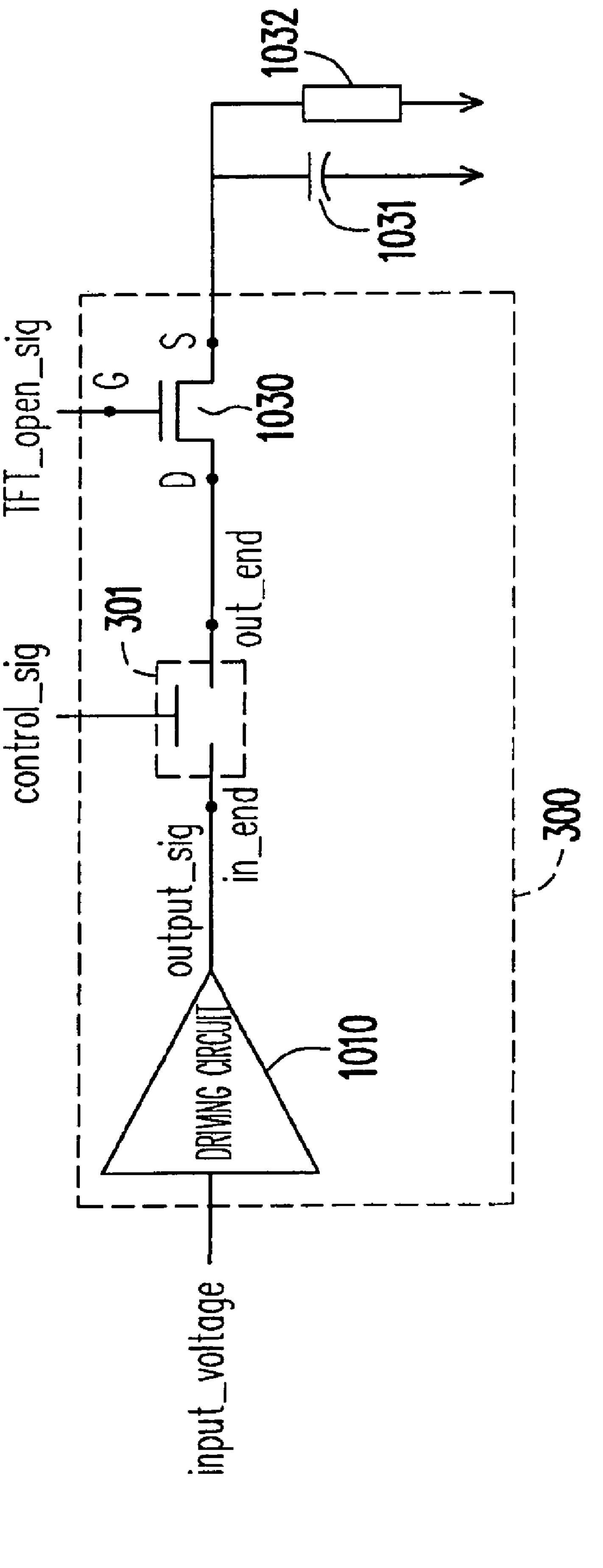
FIG. 3 is a circuit diagram of another conventional driving apparatus 300 applied to the LCD system 100.
Figure 4:
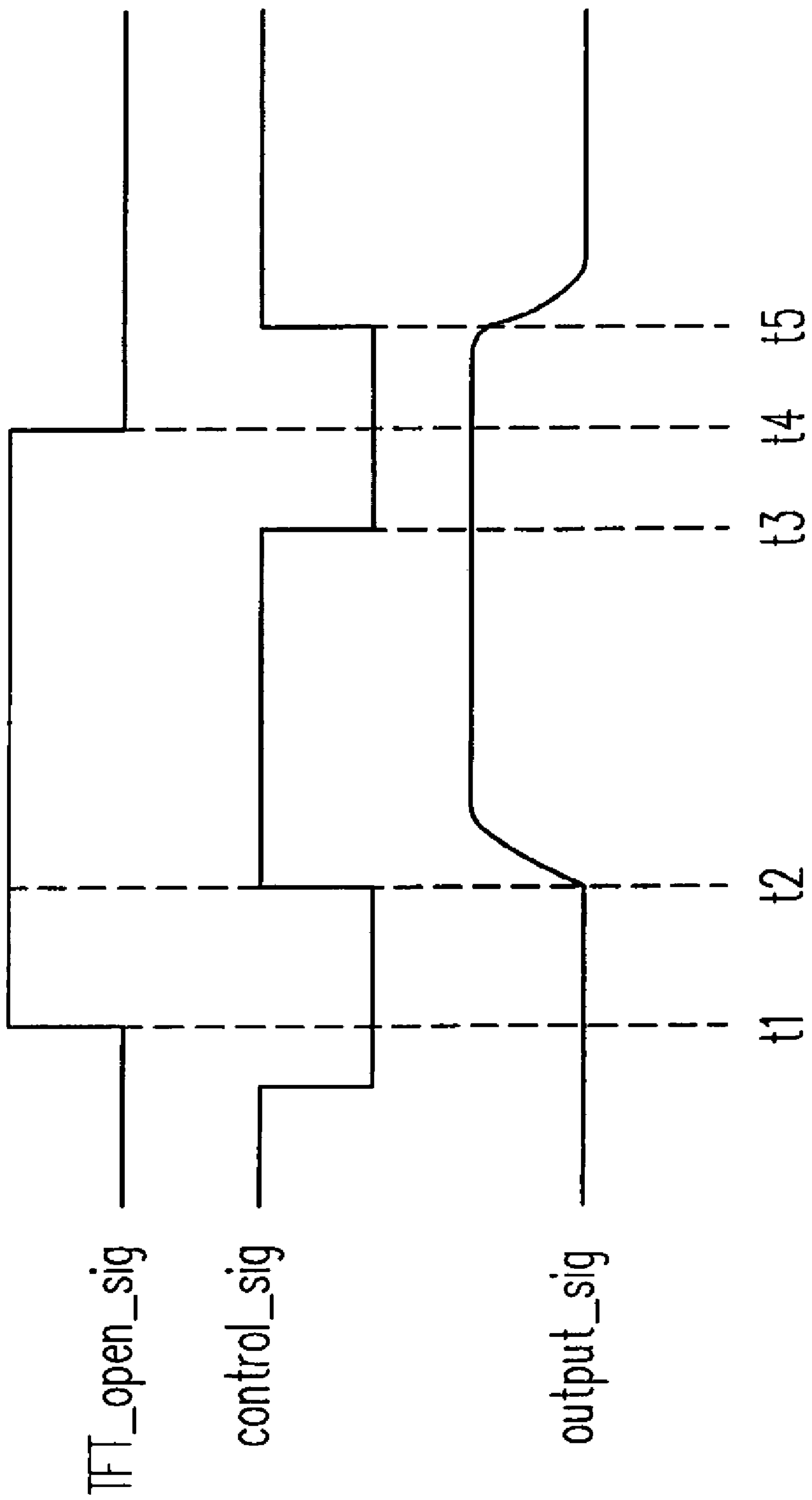
FIG. 4 is a signal waveform diagram of the conventional driving apparatus 300.

Reference will now be made in detail to the present preferred embodiments of the invention, examples of which are illustrated in the accompanying drawings. Wherever possible, the same reference numbers are used in the drawings and the description to refer to the same or like parts.

In order to solve the problem in the prior art that an excessive spike current may occur as the control switch in a conventional driving apparatus is turned on, the present invention adopts a soft start concept for controlling the control switch to lower down spike current, wherein the spike current generated as turning on or off the control switch is controlled by using a control signal so as to lower down the spike current.

Figure 5:
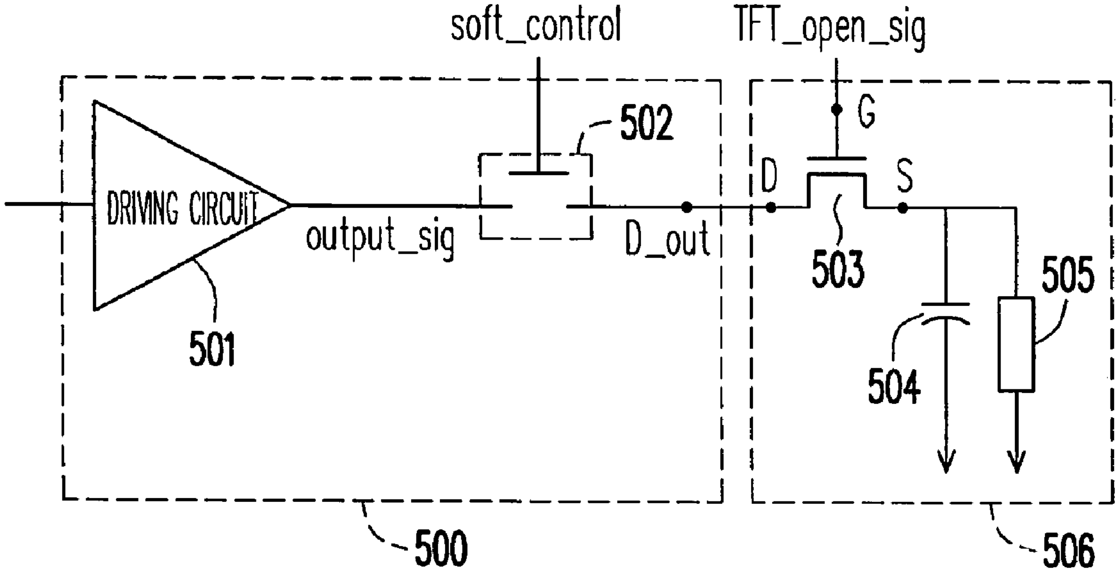
FIG. 5 is a circuit diagram of a driving apparatus according to an embodiment of the present invention.

FIG. 5 is a circuit diagram of a driving apparatus according to an embodiment of the present invention. Referring to FIG. 5, a driving apparatus 500 has at least an output terminal D_out, a driving circuit 501 and a control switch 502, wherein the control switch 502 is electrically coupled with the driving circuit 501. The driving circuit 501 herein is used for receiving an input signal and converting the received input signal into an analog driving signal. The control switch 502 is used for receiving a control signal soft_control, wherein the control signal soft_control is used for controlling the control switch 502 to be turned on, so that the analog driving signal is output to the output terminal D_out of the driving apparatus 500. The control signal soft_control further controls the spike current as the control switch 502 is turned on so as to lower down the spike current.

In FIG. 5, the output terminal D_out of the driving apparatus 500 is further electrically coupled with a panel unit 506, and the panel unit 506 includes a TFT 503, a capacitor 504 and a liquid crystal unit 505, wherein the capacitor 504 is electrically coupled with the source S of the TFT 503, the liquid crystal unit 505 is electrically coupled with the source S of the TFT 503, the gate G of the TFT 503 is used for receiving a switching signal TFT_open_sig and the drain D of the TFT 503 is electrically coupled with the output terminal D_out of the driving apparatus 500.

Figure 6:
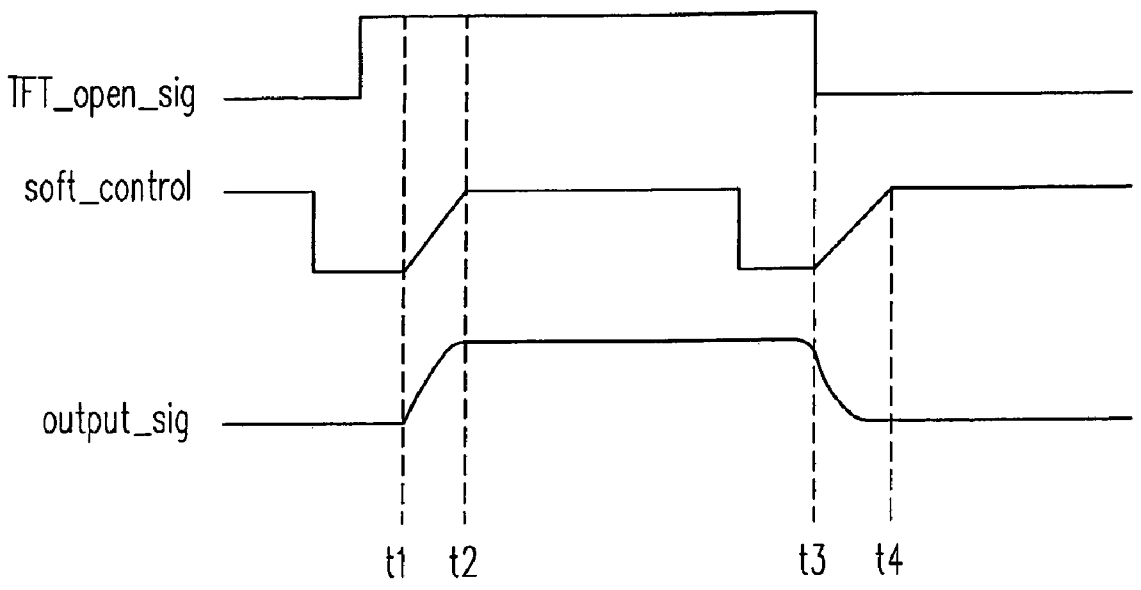
FIG. 6 is a signal waveform diagram of the embodiment of FIG. 5.

FIG. 6 is a signal waveform diagram of the embodiment of FIG. 5. Referring to FIG. 6, when the switching signal TFT_open_sig turns on the TFT 503 and the control signal soft_control gradually varies from a low level to a high level (as shown in FIG. 6, from time $t_1$ to time $t_2$), the control signal soft_control would control the current flowing through the control switch 502, so that the current flowing through the control switch 502 gently rises, and the spike current generated as turning on the control switch 502 gets controlled and thereby reduced. When the switching signal TFT_open_sig is switched to the low level and the control signal soft_control varies from the low level to the high level (as shown in FIG. 6, from time $t_3$ to time $t_4$), the control signal soft_control would control the current flowing through the control switch 502, so that the current flowing through the control switch 502 gently falls, and the spike current generated as turning on the control switch 502 gets controlled and thereby reduced.

Although the output terminal D_out of the above-mentioned driving apparatus 500 is electrically coupled with the panel unit 506, but in fact, the output terminal D_out of the driving apparatus 500 is able to be electrically coupled with other loads for different purposes. The embodiment in FIG. 5 is, but not limited by the present invention, an implementation example applied to an LCD system only.

Figure 7:
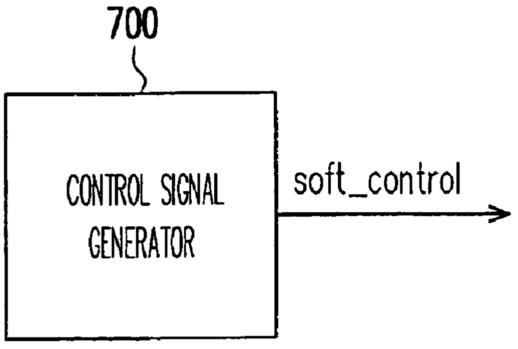
FIG. 7 is a block diagram of a control signal generator 700.
Figure 8:
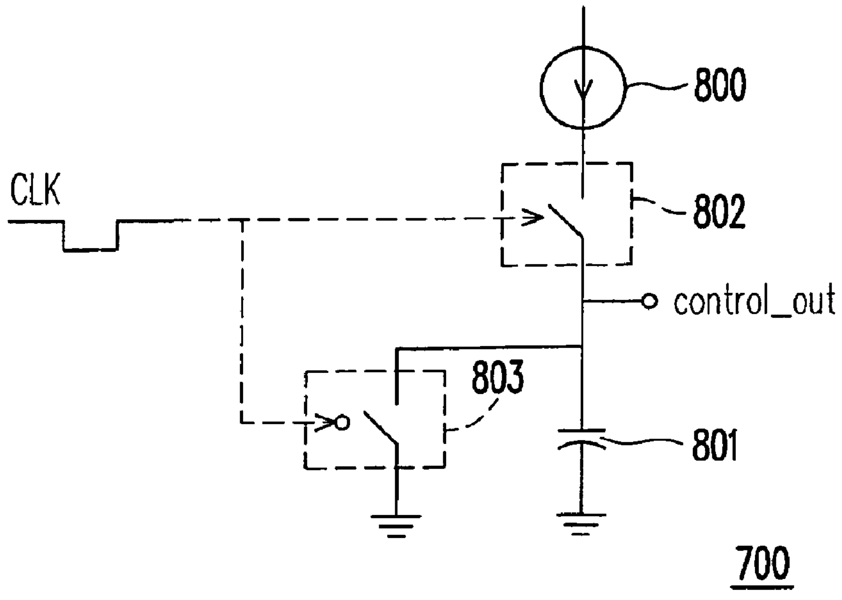
FIG. 8 is an implementation circuit of the control signal generator 700.

Referring to FIG. 7, the above-mentioned control signal soft_control can be generated by a control signal generator 700 to achieve the expected effect of controlling the control switch 502 by using the above-mentioned control signal soft_control. FIG. 8 is an implementation circuit of the control signal generator 700. Referring to FIG. 8, the control signal generator 700 includes a current source 800, a capacitor 801, a first switch 802 and a second switch 803, wherein the first switch 802 is electrically coupled with the capacitor 801 and the current source 800 and the second switch 803 is electrically coupled with the capacitor 801. The control signal generator 700 has a control signal output terminal control_out located between the first switch 802 and the capacitor 801, and the control signal output terminal control_out is used for outputting a control signal soft_control. The first switch 802 and the second switch 803 are controlled by a clock signal CLK, so that the first switch 802 and the second switch 803 are served as a pair of ping-pong switches (that is, when the first switch 802 is turned on, the second switch 803 is turned off, or when the second switch 803 is turned on, the first switch 802 is turned off). When the first switch 802 is turned on, the second switch 803 is turned off and the current source 800 charges the capacitor 801. When the second switch 803 is turned on, the first switch 802 is turned off and the capacitor 801 discharges through the second switch 803. By using the above-mentioned charging and discharging of the capacitor 801, a control signal soft_control is generated at the control signal output terminal control_out of the control signal generator 700.

Figure 9:
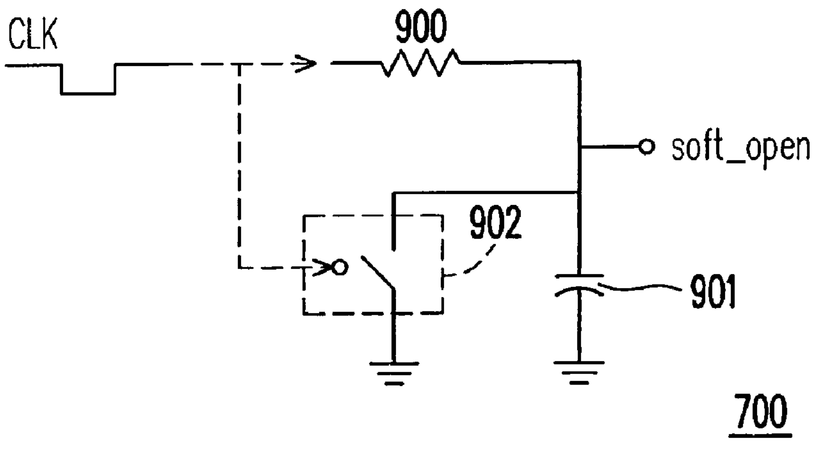
FIG. 9 is another implementation circuit of the control signal generator 700.

The embodiment of FIG. 8 is an implementation of the control signal generator 700 only, and the control signal generator 700 has other implementations. FIG. 9 is another implementation circuit of the control signal generator 700. Referring to FIG. 9, the control signal generator 700 includes a resistor 900, a capacitor 901 and a second switch 902. The capacitor 901 herein is electrically coupled with the resistor 900 and the second switch 902 is electrically coupled with the capacitor 901. The control signal generator 700 has a control signal output terminal soft_open located between the resistor 900 and the capacitor 901 for outputting the control signal soft_control. The second switch 902 is controlled by a clock signal CLK. When the second switch 902 is turned off, the clock signal CLK flows through the resistor 900 and charges the capacitor 901; when the second switch 902 is turned on, the capacitor 901 discharges through the second switch 902 and the resistor 900. By using the above-mentioned charging and discharging of the capacitor 901, a control signal soft_control is generated at the control signal output terminal soft_open of the control signal generator 700.

The above-described two implementations of the control signal generator 700 do not limit the present invention. The control signal generator 700 has other implementations, which still fall within the scope of the present invention and are covered by the claims hereinafter.

Figure 10:
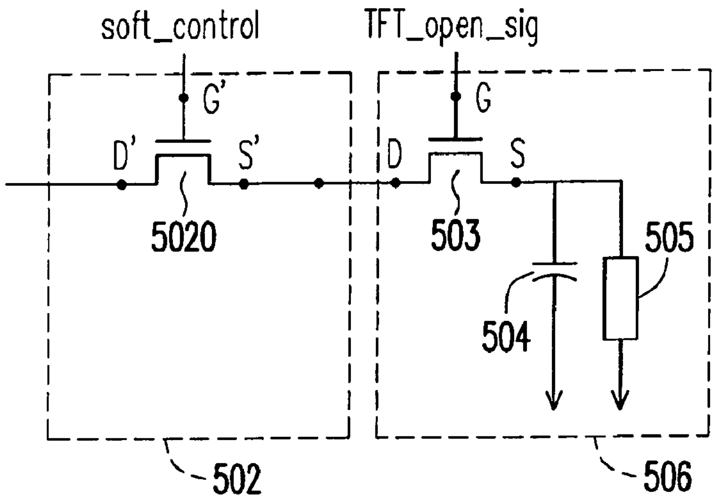
FIG. 10 is an implementation circuit diagram of a control switch 502.

FIG. 10 is an implementation circuit diagram of a control switch 502. The control switch 502 herein includes an N-type transistor 5020 and has an input terminal, an output terminal and a control terminal. In the present invention, the input terminal of the control switch 502 is the drain D' of the N-type transistor 5020, the output terminal thereof is the source S' of the N-type transistor 5020 and the control terminal thereof is the gate G' of the N-type transistor 5020. The control terminal of the control switch 502 is used for receiving a control signal soft_control, and the control signal soft_control is used for controlling the control switch 502 to be turned on and further for controlling the impedance between the input terminal and the output terminal of the control switch 502 as turning on the control switch 502, so as to control and reduce the spike current generated as the control switch 502 is turned on.

Continuing to FIG. 10, the N-type transistor 5020 is operated in a triode region (linear region) for serving as the control switch 502, wherein the resistance between the drain D' and the source S' of the N-type transistor 5020 has, $R_{ds}=1/[uCox(W/L)(V_{gs}-V_t)]$, wherein, u is the surface mobility, Cox is the gate capacitance, W/L is the channel ratio of width and length, $V_{gs}$ is the voltage difference between gate G' and source S', $V_t$ is the threshold voltage of the transistor 5020, and uCox(W/L) is related to the process parameters and $V_{gs}$ represents the voltage difference between the gate G' and the source S' of the N-type transistor 5020. Usually, it is assumed that $uCox=2.5\times10^{-6}$ μA/V$^2$, W/L=50, $V_t$=1V and $V_{gs}$=21V. Thus, the resistance $R_{ds}$ between the input terminal and the output terminal of the turned-on control switch 502 can be obtained by $R_{ds}$=0.4 KΩ. When the influence of the TFT 503 is ignored and assuming the voltage difference between the input terminal and the output terminal of the control switch 502 is 10V, the generated spike current is about 25 mA as turning on the control switch 502. It can be seen from the above described, if the voltage at the control terminal of the control switch 502 gets controlled, the resistance between the input terminal and the output terminal of the control switch 502 accordingly gets controlled, which can be used to control and reduce the spike current generated as turning on the control switch 502. If the control signal soft_control rises from 0V to 11V from time 0 μs to time 0.25 μs and further rises from 11V to 21V from time 0.25 μs to time 0.5 μs; then, during the period from time 0 μs to time 0.25 μs, the resistance $R_{ds}$ between the input terminal and the output terminal of the control switch 502 is at least 0.8 KΩ and the spike current generated by the control switch 502 at the time would be less that 12.5 mA. Moreover assuming the capacitor 504 has a capacitance of 500 pf, the voltage of the capacitor 504 can be calculated by C×V=I×T to be 6.25V, where C is the capacitance of the capacitor 504, V is the voltage difference between the input terminal and the output terminal of the control switch 502, I is the spike current passing through the control switch 502, and T is the time period that the spike current I passing through the control switch 502. Thereafter, during the period from time 0.25 μs to time 0.5 μs, the voltage difference between the input terminal and the output terminal of the control switch 502 is (10V−6.25V)=3.75V; thus, at the time 0.5 μs, the spike current generated by the control switch 502 is 3.75V/0.4 KΩ=9.375 mA. It is obvious from the above-described expression that the spike current generated by the control switch provided by the present invention is less that that of the conventional control switch.

Figure 11:
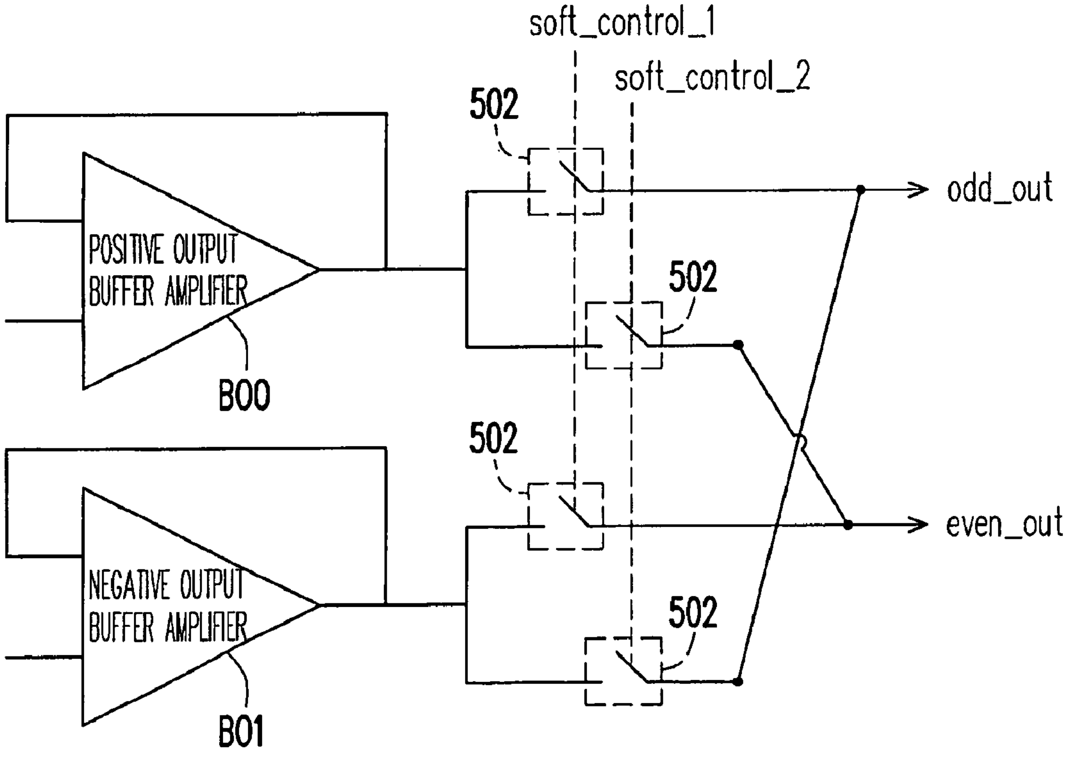
FIG. 11 is a circuit diagram of the control switch 502 applied to a polarity-inverting circuit.
Figure 12:
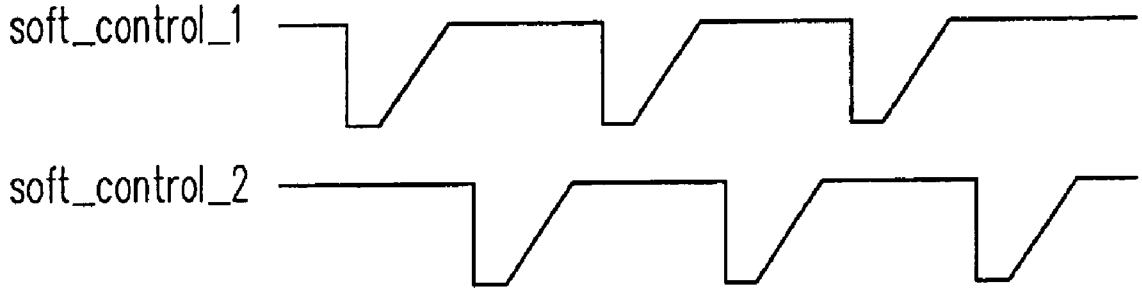
FIG. 12 is the signal waveforms diagram of the control signals soft_control_1 and soft_control_2.

FIG. 10 is an implementation of the control switch 502 only, which does not limit the present invention. All the designs wherein a control signal soft_control is used to control the resistance between the input terminal and the output terminal of the control switch 502 so as to reduce the spike current fall within the scope the claims of the present invention cover. Although the control switch 502 of FIG. 10 is used in a driving apparatus 500, however, the control switch 502 can be applied to other circuits as well. Specifically, when the control switch 502 of FIG. 10 is applied to other applications, the control signal soft_control thereof can be also generated by a control signal generator, which can be implemented by referring to FIG. 8 or FIG. 9. FIG. 11 is a circuit diagram of the control switch 502 applied to a polarity-inverting circuit and FIG. 12 is the signal waveforms diagram of the control signals soft_control_1 and soft_control_2. Referring to FIGS. 11 and 12, the polarity-inverting circuit includes four control switches 502, a positive output buffer amplifier B00 and a negative output buffer amplifier B01, wherein two control signals soft_control_1 and soft_control_2 are respectively generated by two control signal generators.

Figure 13:
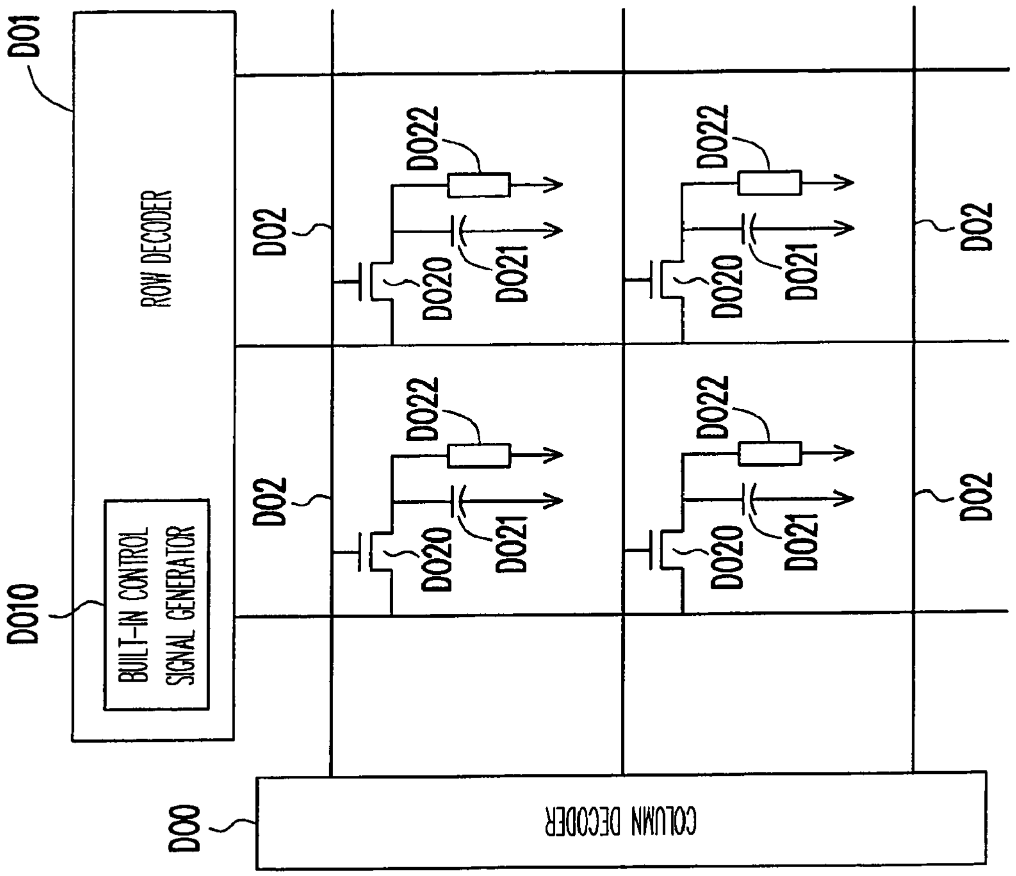
FIG. 13 is a circuit diagram of a driving apparatus 500 applied to an LCD system.

FIG. 13 is a circuit diagram of a driving apparatus 500 applied to an LCD system. Referring to FIG. 13, an LCD system herein has at least a receiving terminal for receiving an input signal and includes at least a panel unit D02, a column decoder D00 and a row decoder D01, wherein the panel unit D02 is used for displaying images specified by the input signal and includes a TFT D020, a capacitor D021 and a liquid crystal unit D022. The capacitor D021 is electrically coupled with the TFT D020 and the liquid crystal unit D022 is electrically coupled with the TFT D020 and the capacitor D021. The column decoder D010 is used for control on or off of the TFT D020. The row decoder D021 has at least a driving apparatus 500 for converting the input signal into an analog driving signal and sending the analog driving signal to the panel unit D02, so that the panel unit D02 displays an image specified by an input data, wherein row decoder D01 of the LCD system further includes a built-in control signal generator D010 for generating a control signal. The built-in control signal generator D010 can be implemented referring to the implementations of FIG. 8 or FIG. 9.

Figure 14:
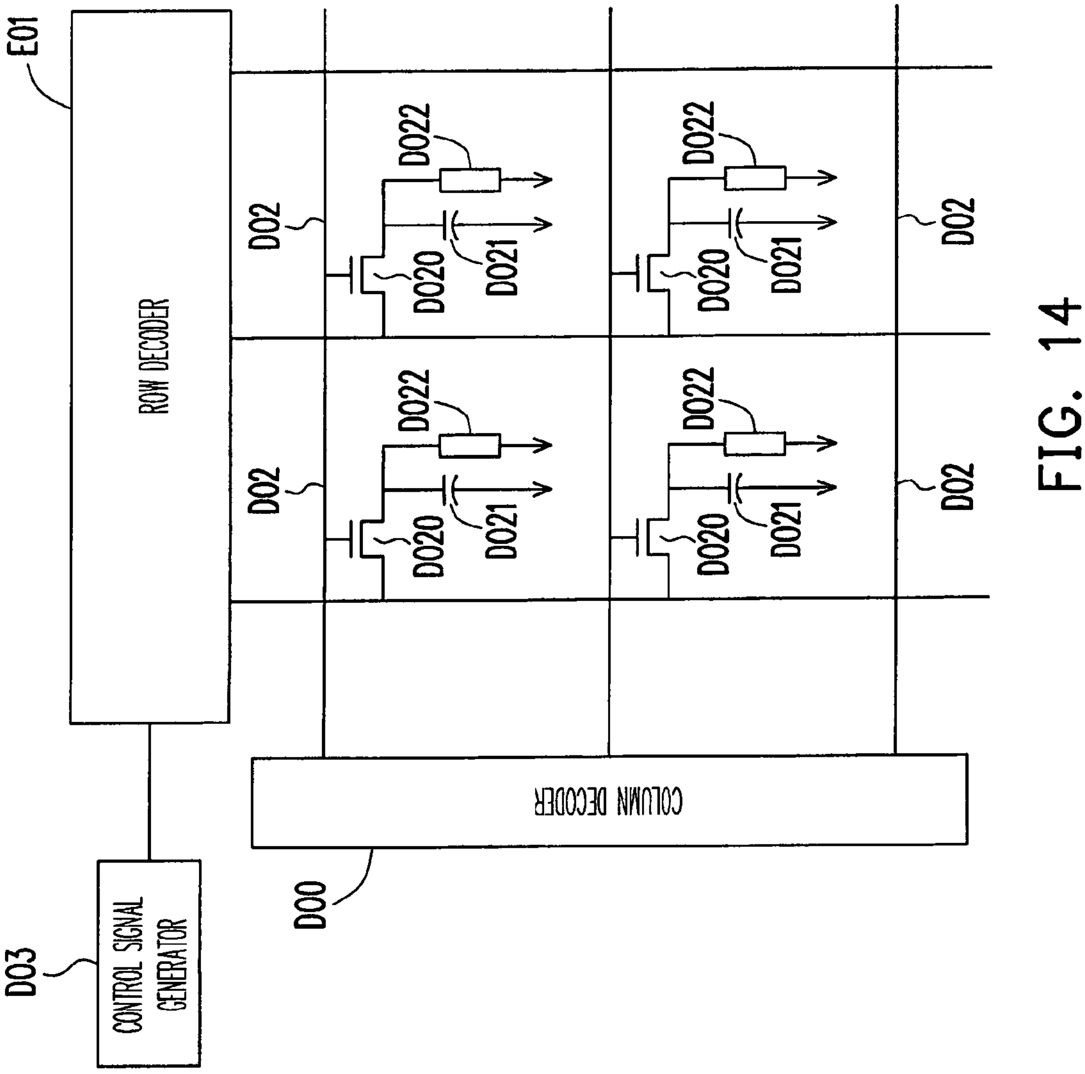
FIG. 14 is another circuit diagram of the driving apparatus 500 applied to an LCD system.

FIG. 14 is another circuit diagram of the driving apparatus 500 applied to an LCD system. Referring to FIG. 14, the row decoder E01 in FIG. 14 has no built-in control signal generator, but the LCD system in FIG. 14 has further a control signal generator D03 electrically coupled with the row decoder E01, which is somehow different from the embodiment of FIG. 13, where the row decoder D01 includes a built-in control signal generator D010. Except for the above described, the embodiment of FIG. 14 is the same as the embodiment of FIG. 13.

Figure 15:
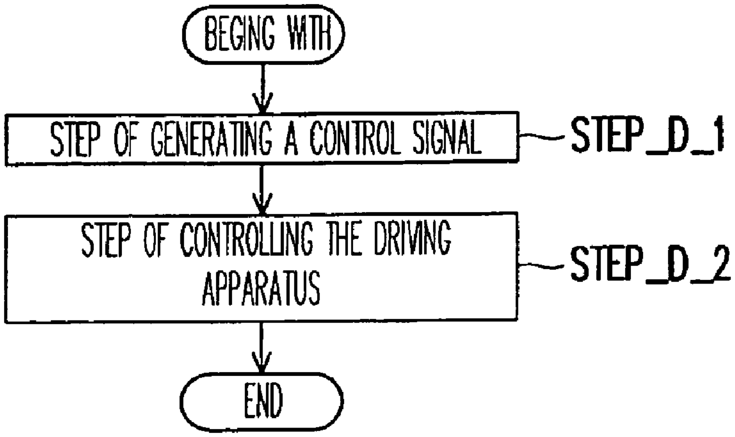
FIG. 15 is a flowchart diagram of a method for reducing the spike current generated by a driving apparatus.

FIG. 15 is a flowchart diagram of a method for reducing the spike current generated by a driving apparatus. Referring to FIG. 15, the driving apparatus in FIG. 15 has a control switch disposed at the output terminal thereof. The method in FIG. 15 includes following steps: in step STEP_D_1, a control signal is generated; in step STEP_D_2, the control signal is used to control the control switch at the output terminal of the driving apparatus, wherein the control signal is used for controlling on or off of the control switch at the output terminal of the driving apparatus so as to reduce the spike current. As the above described, the method is able to be applied to an LCD system.

Figure 16:
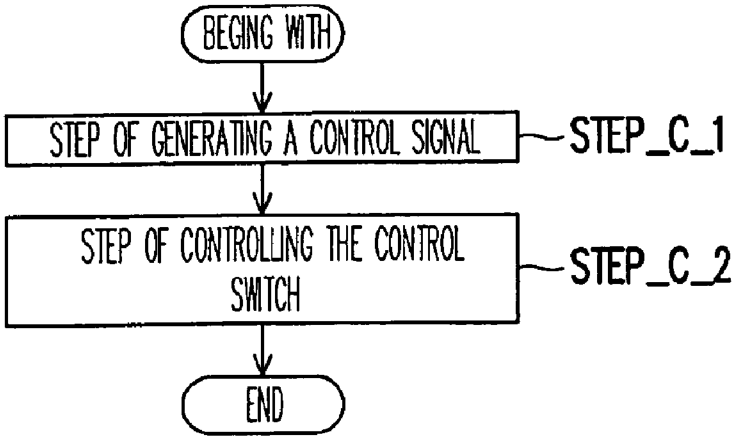
FIG. 16 is a flowchart diagram of a method for reducing the spike current generated by a control switch.

FIG. 16 is a flowchart diagram of a method for reducing the spike current generated by a control switch. Referring to FIG. 16, a control switch herein includes a control terminal, an input terminal and an output terminal, and the control terminal is used for receiving a control signal. The method of FIG. 16 includes following steps: in step STEP_C_1, a control signal is generated; in step STEP_C_2, the control signal is used to control the control switch, wherein the control signal is used for controlling on or off of the control switch and controlling the impedance between the input terminal and the output terminal as turning on the control switch so as to reduce the spike current. As the above described, the method is able to be applied to an LCD system.

In summary, the LCD system, the driving apparatus and the control switch provided by the embodiments of the present invention respectively have a less spike current during turning on; therefore, the LCD system, the driving apparatus and the control switch provided by the embodiments of the present invention have longer life time, lower electricity consumption and better heat dissipation performance.

The above described are preferred embodiments of the present invention only, which do not limit the implementation scope of the present invention. It will be apparent to those skilled in the art that various modifications and equivalent variations can be made to the structure of the present invention without departing from the scope or spirit of the invention.

What is claimed is:

1. A liquid crystal display system, receiving an input signal and comprising:
- a display panel, having a plurality of display cells and for displaying images specified by the input signal, wherein each of the display cells is controlled by a switching signal;
- a column decoder for controlling the displaying status of the display panel; and
- a row decoder, having a driving apparatus for converting the input signal into an analog driving signal, and sending the analog driving signal to the display panel so as to make the display panel display images specified by the input signal, wherein the driving apparatus comprises:
  - a driving circuit for receiving the input signal and converting the input signal into the analog driving signal; and
  - a control switch, electrically coupled with the driving circuit for receiving a control signal, wherein the control signal is used for controlling on or off of the control switch so as to control the spike current generated when turning on the control switch; and
- wherein the control signal gently increases by a rate having a constant slope during a first period and a second period, the analog driving signal gently increases during the first period and gently decreases during the second period, and an initial time point of the second period substantially starts at a falling edge of the switching signal.

2. The liquid crystal display system according to claim 1, wherein the driving apparatus further comprises a control signal generator for generating the control signal.

3. The liquid crystal display system according to claim 2, wherein the control signal generator comprises:
- a current source;
- a capacitor for charging and discharging;
- a first switch, electrically coupled with the capacitor and the current source and controlled by a clock signal; and
- a second switch, electrically coupled with the capacitor and controlled by the clock signal;
- wherein the control signal generator has a control signal output terminal located between the first switch and the capacitor for outputting the control signal; when the first switch is turned on, the second switch is turned off and at the time the current source charges the capacitor; when the second switch is turned on, the first switch is turned off and at the time the capacitor discharges via the second switch.

4. The liquid crystal display system according to claim 2, wherein the control signal generator comprises:
- a resistor;
- a capacitor, electrically coupled with the resistor and for charging and discharging; and
- a second switch, electrically coupled with the capacitor and controlled by the clock signal;
- wherein the control signal generator has a control signal output terminal located between the resistor and the capacitor for outputting the control signal; when the second switch is turned off, the clock signal flows through the resistor and charges the capacitor; when the second switch is turned on, the capacitor discharges via the second switch and the resistor.

5. The liquid crystal display system according to claim 1, wherein the control switch is a transistor.

6. A method for reducing a spike current generated by a driving apparatus in a display apparatus, wherein the display apparatus comprises a display panel having a plurality of display cells, each of the display cells is controlled by a switching signal, and an output terminal of the driving apparatus has a control switch; the method comprising:
- generating a control signal; and
- using the control signal to control the control switch at the output terminal of the driving apparatus;
- wherein the control signal is able to control on or off of the control switch at the output terminal of the driving apparatus and control the spike current generated when turning on the control switch so as to reduce the spike current; and
- wherein the control signal gently increases by a rate having a constant slope during a first period and a second period, an analog signal gently increases during the first period and gently decreases during the second period, and an initial time point of the second period substantially starts at a falling edge of the switching signal.

* * * * *